(12) United States Patent
Wu et al.

(10) Patent No.: US 9,515,680 B2
(45) Date of Patent: Dec. 6, 2016

(54) FAST MAPPING METHOD FOR LAYERED MIN-SUM DECODING OF LDPC CODES,

(71) Applicant: Tidal Systems, Inc., Santa Clara, CA (US)

(72) Inventors: Yingquan Wu, Palo Alto, CA (US); Xiaojie Zhang, San Jose, CA (US)

(73) Assignee: Tidal Systems, Inc., Santa Clara, CA (US)

( * ) Notice: Subject to any disclaimer, the term of this patent is extended or adjusted under 35 U.S.C. 154(b) by 148 days.

(21) Appl. No.: 14/511,551

(22) Filed: Oct. 10, 2014

(65) Prior Publication Data

US 2016/0105199 A1 Apr. 14, 2016

(51) Int. Cl.
*H03M 13/00* (2006.01)
*H03M 13/11* (2006.01)

(52) U.S. Cl.
CPC ......... *H03M 13/112* (2013.01); *H03M 13/114* (2013.01); *H03M 13/6594* (2013.01)

(58) Field of Classification Search
None
See application file for complete search history.

(56) References Cited

U.S. PATENT DOCUMENTS

| 2008/0052558 A1* | 2/2008 | Sun | H03M 13/1105 714/11 |
| 2012/0029911 A1* | 2/2012 | Noh | G10L 19/24 704/201 |
| 2013/0128373 A1* | 5/2013 | Qin | G11B 27/36 360/31 |

OTHER PUBLICATIONS

D. Oh, "Nonuniformly Quantized Min-Sum Decoder Architecture for Low-Density Parity-Check Codes", in GLSVLSI '08 Proceedings of the 18th ACM Great Lakes symposium on VLSI, pp. 451-456, ACM New York, NY, USA © 2008, ISBN: 9781-59593-999-9.*
Zhang, et al., "Quantized Min-Sum Decoders with Low Error Floor for LDPC Codes," in Proc. IEEE International Symposium Information Theory (ISIT), Cambridge, MA, Jul. 25, 2012, pp. 2871-2875.
Zhang, et al.,"Will the Real Error Floor Please Stand Up?" in Proc. IEEE International Conference on Signal Processing and Communications (SPCOM), Bangalore, India, Jul. 22-25, 2012, pp. 1-5.

* cited by examiner

*Primary Examiner* — Daniel McMahon
(74) *Attorney, Agent, or Firm* — Brooks, Cameron & Huebsch, PLLC

(57) ABSTRACT

A method is disclosed for performing LDPC decoding, specifically layered min-sum decoding using a Tanner graph including check nodes (CN) and variable nodes (VN). Messages passed between nodes are quantized in a non-uniform manner. Values below a threshold are uniformly quantized whereas values above the threshold are non-uniformly quantized. A corresponding inverse-quantization is also defined.

19 Claims, 4 Drawing Sheets

FAST MAPPING METHOD FOR LAYERED MIN-SUM DECODING OF LDPC CODES,

BACKGROUND

Field of the Invention

This invention relates to systems and methods for implementing a low density parity check (LDPC) decoding algorithm.

Background of the Invention

A binary low-density parity-check (LDPC) code is a binary linear block code with a parity-check matrix that has a low density of 1 s. This property makes it convenient to represent an LDPC code described by parity-check matrix H with a bipartite graph, called a Tanner Graph. The two types of nodes in a Tanner graph are the variable nodes (VNs) and the check nodes (CNs). The variable nodes are also known as bit nodes or left nodes, and the check nodes are also known as constraint nodes or right nodes. Every variable node (or check node) corresponds to a column (or row) of the parity-check matrix H. $V=\{v_1, \ldots, v_n\}$ denotes the set of variable nodes, and by $C=\{c_1, \ldots, c_m\}$ the set of check nodes. Each row is indexed by $\mathcal{J}=\{1, \ldots, m\}$ and each column of H by $I=\{1, \ldots, n\}$. In this application, both the notation CN i and VN j and the notation CN $c_i$ and VN $v_j$ are used herein, depending on the context. In the Tanner graph, VN vi is connected to CN cj via an edge if $H_{j,i}=1$, and the set of edges on the Tanner graph is denoted by set E.

The systems and methods disclosed herein provide an improved approach for performing LDPC decoding using Tanner graphs.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1:
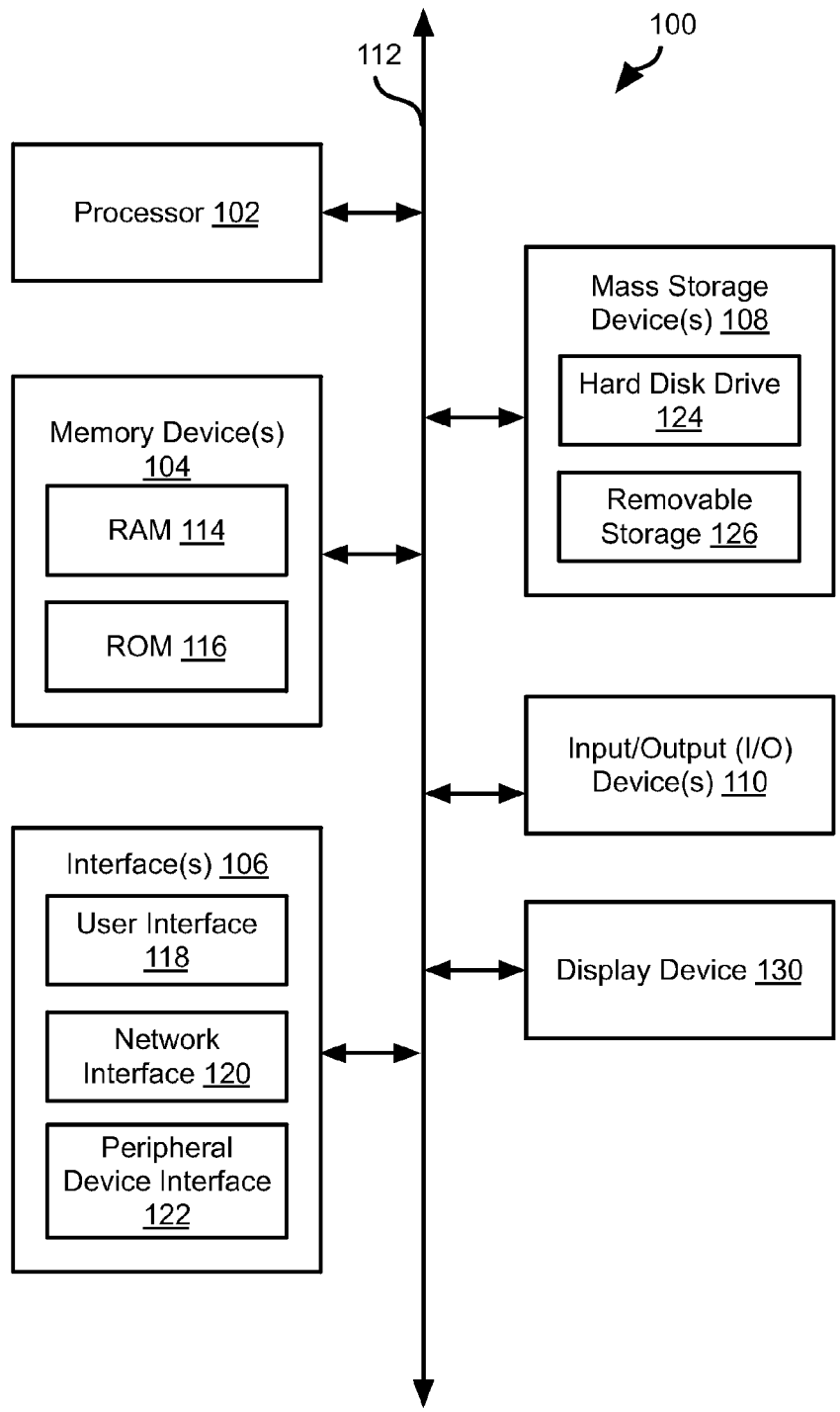
FIG. 1 is a schematic block diagram of a computer system suitable for implementing methods in accordance with embodiments of the invention.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods. Accordingly, the invention has been developed to provide apparatus and methods performing LDPC decoding. A method is disclosed for performing LDPC decoding, specifically layered min-sum decoding using a Tanner graph including check nodes (CN) and variable nodes (VN). Messages passed between nodes are quantized in a non-uniform manner. Values below a threshold are uniformly quantized whereas values above the threshold are non-uniformly quantized. A corresponding inverse-quantization is also defined.

Any combination of one or more computer-usable or computer-readable media may be utilized, including non-transitory media. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

FIG. 1 is a block diagram illustrating an example computing device 100. Computing device 100 may be used to perform various procedures, such as those discussed herein. Computing device 100 can function as a server, a client, or any other computing entity. Computing device can perform various functions as discussed herein. Computing device 100 can be any of a wide variety of computing devices, such as a desktop computer, a notebook computer, a server computer, a handheld computer, tablet computer and the like. In some embodiments, a hardware device containing circuits implementing the methods disclosed herein may be included in the computing device 100 or embedded in any of the components of the computing device listed below.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer-readable media, such as cache memory.

Memory device(s) 104 include various computer-readable media, such as volatile memory (e.g., random access memory (RAM) 114) and/or nonvolatile memory (e.g., read-only memory (ROM) 116). Memory device(s) 104 may also include rewritable ROM, such as Flash memory.

Mass storage device(s) 108 include various computer readable media, such as magnetic tapes, magnetic disks, optical disks, solid-state memory (e.g., Flash memory), and so forth. As shown in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, microphones, monitors or other display devices, speakers, printers, network interface cards, modems, lenses, CCDs or other image capture devices, and the like.

Display device 130 includes any type of device capable of displaying information to one or more users of computing device 100. Examples of display device 130 include a monitor, display terminal, video projection device, and the like.

Interface(s) 106 include various interfaces that allow computing device 100 to interact with other systems, devices, or computing environments. Example interface(s) 106 include any number of different network interfaces 120, such as interfaces to local area networks (LANs), wide area networks (WANs), wireless networks, and the Internet. Other interface(s) include user interface 118 and peripheral device interface 122. The interface(s) 106 may also include one or more user interface elements 118. The interface(s) 106 may also include one or more peripheral interfaces such as interfaces for printers, pointing devices (mice, track pad, etc.), keyboards, and the like.

Bus 112 allows processor(s) 102, memory device(s) 104, interface(s) 106, mass storage device(s) 108, and I/O device(s) 110 to communicate with one another, as well as other devices or components coupled to bus 112. Bus 112 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 100, and are executed by processor(s) 102. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 2:
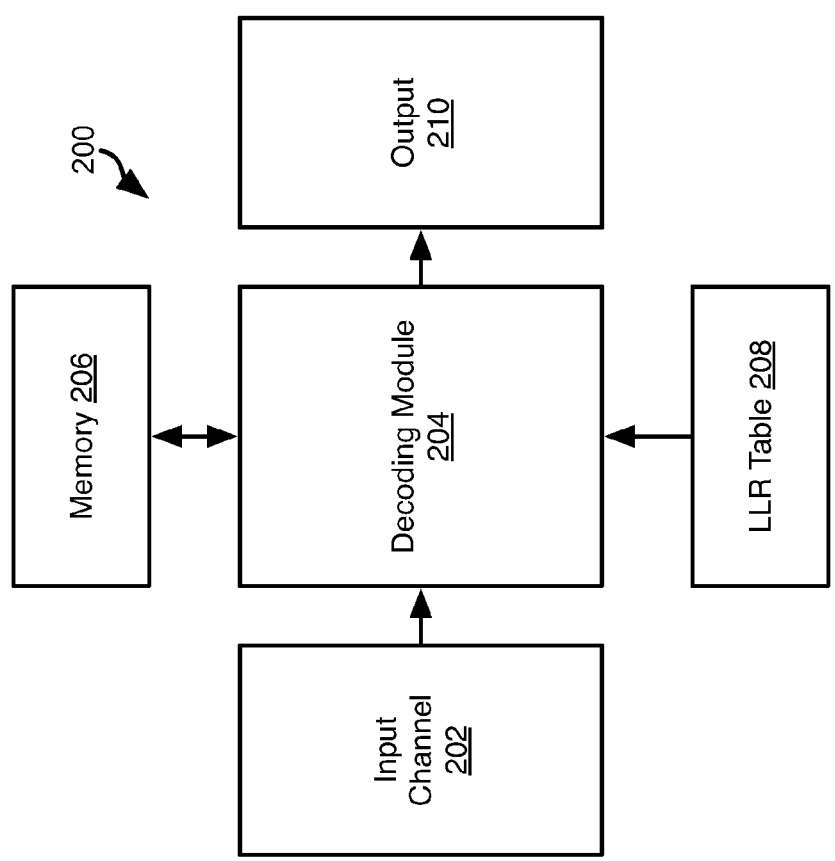
FIG. 2 is a schematic block diagram of components for implementing methods in accordance with embodiments of the invention.

Referring to FIG. 2, the illustrated system 200 may be used to perform the methods disclosed herein. The illustrated components may be specific electronic components or software modules executed by a computing device 100. The system 200 may include an input channel 202 from which data is received. The input channel 202 may be any device or interface. The data from the input channel 202 may be received by a decoding module 204 implementing the methods disclosed herein. As noted above, the decoding module 204 may be implemented by software or hard-coded circuits or a digital processor.

The data received from the input channel 202 may be data encoded according to an LDPC encoding algorithm. The decoding module 204 is programmed or configured with circuits implementing the methods disclosed herein in order to perform the decoding. To facilitate decoding, a memory 206 for storing intermediate results and an LLR table 208 may be coupled to the decoding module 204. The decoding module 204 generates an output 210 that is the data extracted from encoded data received from the input channel 202.

Figure 3:
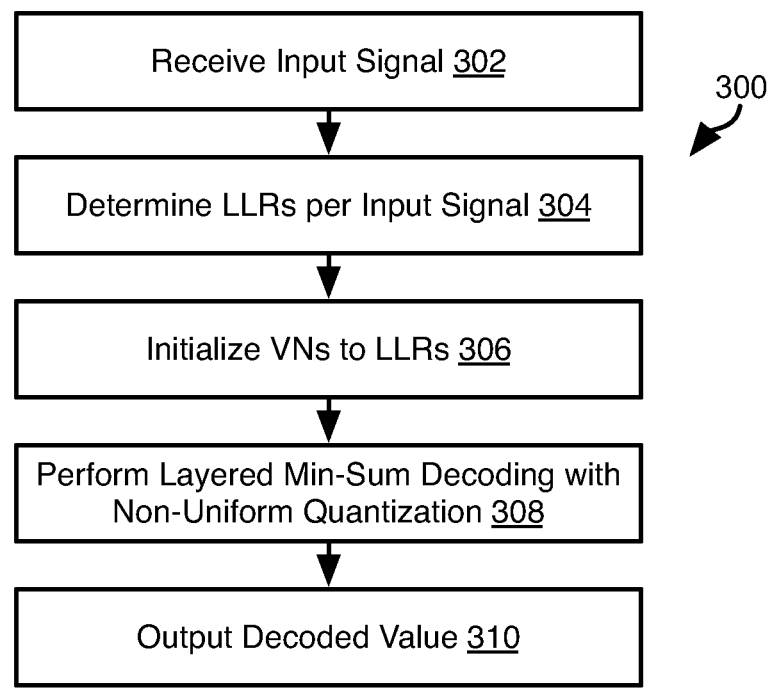
FIG. 3 is a process flow diagram of a method in accordance with an embodiment of the present invention.

Referring to FIG. 3, the system 200, or some other device, such as a general purpose computer, may perform the illustrated method 300. The method 300 may include receiving 302 an input signal and determining 304 one or more log likelihood ratios (LLR) as defined above for one or more symbols in the input signal. The VNs of a Tanner graph as defined above may then be initialized 306 to the LLRs as described above or according to any of the methods described below. The method 300 may further include performing 308 layered min-sum decoding with non-uniform quantization to obtain a decoded value and outputting 310 the decoded value. Performing 308 layered min-sum decoding may include performing Algorithm 1 of Table 1 or Algorithm 2 of Table 2 using the non-uniform quantization approach shown below in Tables 3 and 4 and/or equations (10) and (11).

A. Min-Sum Algorithm

The sum-product algorithm (SPA) decoding is considered to be the optimal decoding algorithms when LDPC codes was first proposed. The optimality criterion in the design of the SPA decoder is symbol-wise maximum a posteriori probability (MAP), and it is an optimal symbol-wise decoder only on Tanner graphs without cycles.

The variable node (VN) and check node (CN) update rules of SPA decoding may be performed as follows. A VN $v_i$, receives an input message $L_i^{ch}$ from the channel, typically the log-likelihood ratio (LLR) of the corresponding channel output defined according to $$L_i^{ch} = \log\left(\frac{Pr(R_i = r_i \mid c_i = 0)}{Pr(R_i = r_i \mid c_i = 1)}\right), \quad (1)$$

where, $c_i \in \{0,1\}$ is the code bit and $r_i$ is the corresponding received symbol.

Denote by $L_{i \to j}$ and $L_{j \to i}$ the messages sent from $v_i$ to $c_j$ and from $c_j$ to $v_i$, respectively, and denote by N(k) the set of neighboring nodes of VN $v_k$ (or CN $c_k$). Then, the message sent from $v_i$ to $c_j$ to in SPA decoding is given by $$L_{i \to j} = L_i^{ch} + \Sigma_{j' \in N(i)\setminus j} L_{j' \to i}, \quad (2)$$

and the message from CN j to VN i is computed as $$L_{j \to i} = 2\tanh^{-1}\left(\prod_{i' \in N(j)\setminus i} \tanh\frac{L_{i' \to j}}{2}\right). \quad (3)$$

In SPA decoding, VN nodes take log-likelihood ratios of received information from the channel as initial input messages, i.e., $L_{i \to j} = L_i^{ch}$.

In practical implementations of the SPA, the following equivalent CN update rule is often used $$L_{j \to i} = [\Pi_{i' \in N(j)\setminus i} \text{sign}(L_{i' \to j})] \cdot \phi^{-1}(\Sigma_{i' \in N(j)\setminus i} \phi(|L_{i' \to j}|)), \quad (4)$$

where $\phi(x) = -\log[\tan h(x/2)] = \log((e^x+1)/(e^x-1))$, $\phi(x) = \phi^{-1}(x)$, and $\phi(\infty) = 0$. In some fixed-point implementations, in order to have better approximation, different look-up tables could be used to compute $\phi(x)$ and $\phi^{-1}(x)$.

In min-sum decoding, the corresponding CN update rule is simplified as follows $$L_{j \to i} = [\Pi_{i' \in N(j)\setminus i} \text{sign}(L_{i' \to j})] \cdot \alpha \cdot (\beta + \min_{i' \in N(j)\setminus i} |L_{i' \to j}|), \quad (5)$$

where $0 < \alpha, \beta < 1$ is the attenuation factor, which can be a fixed constant or adaptively adjusted. In most implementations, for additional simplicity, the attenuation factor or offset is set to be the same fixed constant for all CNs and all iterations.

Figure 4A:
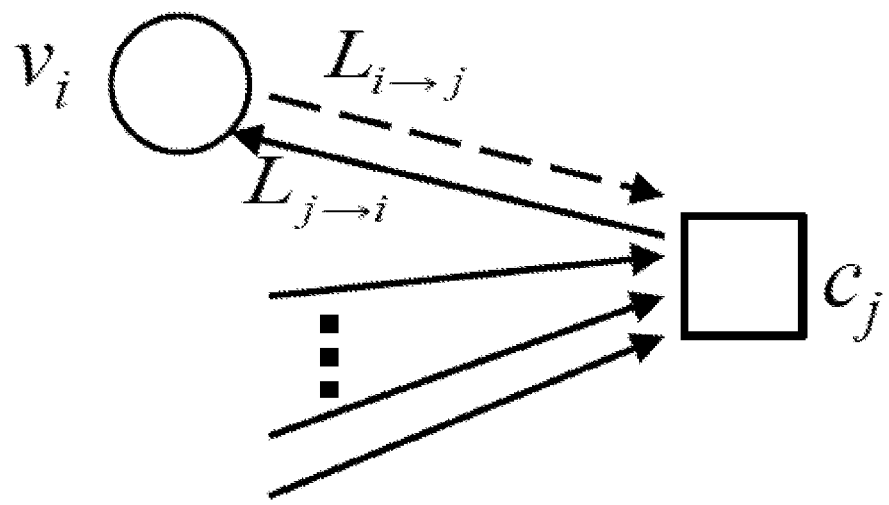
FIGS. 4A and 4B illustrate the passing of messages between check nodes (CN) and variable nodes (VN) in accordance with min-sum decoding.
Figure 4B:
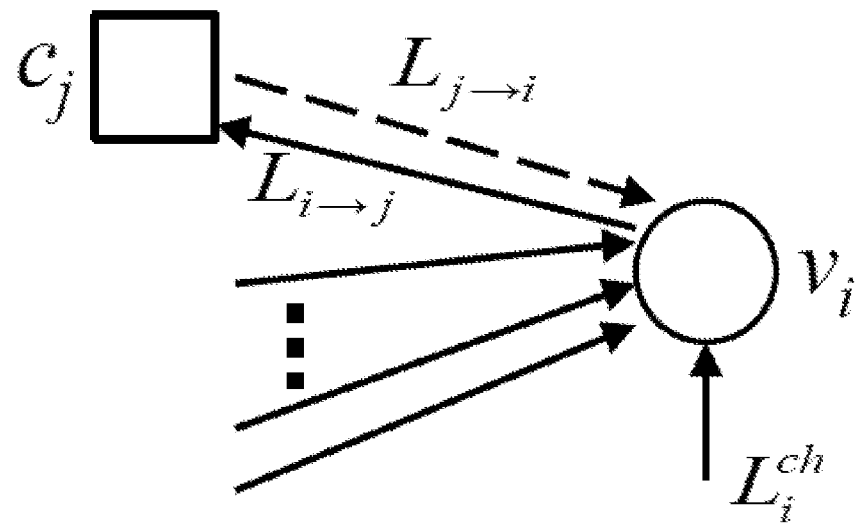

FIG. 4A is a schematic illustration of the CN to VN message update. In particular, each CN receives LLR information from all of its neighboring VNs. For each such VN, it generates an updated "check-to-variable" message using the inputs from all other neighboring VNs. FIG. 4B is a schematic illustration of the VN to CN message update. Each VN receives LLR information from all of its neighboring CNs. For each such VN, it generates an updated "variable-to-check" message using the inputs from all other neighboring CNs.

C. Layered Decoding

The conventional iterative MP decoder alternates between two phases, a "VN-to-CN" phase during which VNs send messages to CNs along their adjacent edges, and a "CN-to-VN" phase during which CNs send messages to their adjacent VNs. The message update rules, whose details will be given later in this section, are depicted schematically in FIGS. 1 and 2, respectively. In the initialization step of the decoding process, VN $v_i$ forwards the same message to all of its neighboring CNs in $CN_i$, namely the LLR $L_i^{ch}$ derived from the corresponding channel output. In the CN-to-VN message update phase, CN $c_j$ uses the incoming messages and CN update rule to compute and forward, to VN $v_i$ in $CN_j$, a new "CN-to-VN" message, $L_{j \to i}$. VN $v_i$ then processes its incoming messages according to VN update rule and forwards to each adjacent CN an updated "VN-to-CN" message, $L_{i \to j}$. After a pre-specified number of iterations, VN $v_i$ sums all of the incoming LLR messages to produce an estimate of the corresponding code bit i. Note that all of the "CN-to-VN" message updates can be done in parallel, as can all of the "VN-to-CN" message updates. This enables efficient, high-speed software and hardware implementations of the iterative MP decoding algorithms.

In the hardware implementation of iterative MP decoding, the decoding efficiency can be further improved by so called the layered decoding approach. The layered decoding is based on a serial update of CN messages. Instead of sending all messages from VNs to CNs, and then all messages from CNs to VNs, the layered coding go over the CNs in some order such that, to each updating CN, all messages are sent in and processed, and then sent out to neighboring VNs. Such scheduled serial updates on CNs enables immediate propagation of the message unlike the conventional scheme where the updated messages can propagate only in next iteration. The layered decoding can be efficiently implemented with significant reduction of memory. This is achieved by using so called $Q_i$ message, defined as $$Q_i = L_i^{ch} + \Sigma_{j' \in N(i)} L_{j' \to i}, \quad (6)$$

and the $L_{j \to i}$ messages to compute the $L_{i \to j}$ messages on the fly, thus avoiding the need to keep an additional memory for the $L_{i \to j}$ messages. Additionally, the same memory that is initialized with the channel messages $L_i^{ch}$ can be used to store the iteratively updated $Q_i$ output messages. Hence, the result is $$L_{i \to j} = Q_i - L_{j \to i} \quad (7)$$

and $$Q_i^{new} = Q_i^{old} - L_{j \to i}^{old} + L_{j \to i}^{new} \quad (8)$$

The layered decoding can be applied to all types of iterative MP decoding, including SAP and min-sum decoding. For example, the complete min-sum layered decoding algorithm is given in Algorithm 1 of Table 1.

TABLE 1

Algorithm 1.

Algorithm 1 Layered Min-Sum Decoding Algorithm
Initialization: $\forall i \in V, \forall j \in C, L_{j \to i} = 0$; and $\forall i \in V, Q_i = L_i^{ch}$
Iteration:
1:     for $\forall j \in C$ do
2:         $L_{i \to j} \leftarrow Q_i - L_{j \to i}, \forall i \in N(j)$
3:         $s_{all} \leftarrow \prod_{i' \in N(j)} \text{sign}(L_{i' \to j})$
4:         $i_{min1} \leftarrow \arg\min_{i' \in N(j)} |L_{i' \to j}|$
5:         $L_{min1} \leftarrow s_{all} \cdot L_{i_{min1} \to j}$
6:         $i_{min2} \leftarrow \arg\min_{i' \in N(j)\setminus i_{min1}} |L_{i' \to j}|$
7:         $L_{min2} \leftarrow s_{all} \cdot L_{i_{min3} \to j}$
8:         for $\forall i \in N(j)$ do TABLE 1-continued Algorithm 1.

```
 9:         if i ≠ i_min1 then
10:             L_{j→i} ← L_min1
11:         else
12:             L_{j→i} ← L_min2
13:         end if
14:         Q_i ← L_{i→j} + L_{j→i}
15:     end for
16: end for
```

Message Quantization with Fast Mapping Method

A novel method for quantization of messages will now be described in detail. In references [1] and [2], a quantization method has been proposed to extend the message quantization range by using exponentially increased step size for large magnitudes while keeping fixed step size for small magnitudes. However, the results in these papers have not been extended to layered min-sum decoding, and the original exponentially increased step size design is also difficult for hardware implementation. In this disclosure, a fast mapping based quantization method is provided to effectively extend the quantization range of the messages with very low complexity for layered min-sum decoding.

In intensive simulations conducted by the inventors of layered min-sum decoding on various LDPC codes, similar to iterative message-passing decoding considered in [1] and [2], also observed was that the range of messages passed between VNs and CNs in the decoder has direct impact on the decoding performance in terms of both converge speed and error-rate. These observation serves as the motivation for a new quantization and mapping method, which will now be described.

Consider first the uniform quantizer with quantization step $\Delta$. For any real number x, it is defined by $$Q_\Delta(x) = \mathrm{sgn}(x)\Delta\left\lfloor \frac{|x|}{\Delta} + \frac{1}{2} \right\rfloor.$$

The outputs of the uniform quantizer are of the form $m\Delta$. The quantization intervals can be visualized by expressing the quantization rule as $$Q_\Delta(x) = \begin{cases} m\Delta, & \text{if } m\Delta - \frac{\Delta}{2} \leq x < m\Delta + \frac{\Delta}{2}, \text{ for } m > 0 \\ 0 & \text{if } -\frac{\Delta}{2} < x < \frac{\Delta}{2} \\ m\Delta & \text{if } m\Delta - \frac{\Delta}{2} < x \leq m\Delta + \frac{\Delta}{2}, \text{ for } m < 0 \end{cases} \quad (9)$$

Table 2 shows an example of 6-bit uniform quantization with $\Delta=1$. The operation of the uniform quantizer is shown only for non-negative inputs. The operation on negative values can be obtained by odd symmetry. Actually, for $\Delta=1$ in this example, the quantization or mapping is simply to threshold the values. When mapping message index back into values, the same table will be used in uniform quantization. One approach to expanding the range of represented values by message index is to increase the step size $\Delta$, without increasing the number of message bits used to represent the input values. This approach, however sacrifices the precision of input values after mapping. Alternatively, one could maintain the value of $\Delta$ and increase the number of message bits to resolve larger magnitudes. This would increase implementation complexity when incorporated into the decoding hardware.

TABLE 2

6-Bit Uniform Quantization with $\Delta = 1$.

| Input Values | Message Index |
|---|---|
| 0 | 0 |
| 1 | 1 |
| 2 | 2 |
| 3 | 3 |
| 4 | 4 |
| 5 | 5 |
| 6 | 6 |
| 7 | 7 |
| 8 | 8 |
| 9 | 9 |
| 10 | 10 |
| 11 | 11 |
| 12 | 12 |
| 13 | 13 |
| 14 | 14 |
| 15 | 15 |
| 16 | 16 |
| 17 | 17 |
| 18 | 18 |
| 19 | 19 |
| 20 | 20 |
| 21 | 21 |
| 22 | 22 |
| 13 | 23 |
| 24 | 24 |
| 25 | 25 |
| 26 | 26 |
| 27 | 27 |
| 28 | 28 |
| 29 | 29 |
| 30 | 30 |
| [31, ∞) | 31 |

In the context of this application, the novel quantizer represents a compromise between these conflicting objectives of retaining fine precision, allowing large range, and controlling implementation complexity as messages grow exponentially in the number of decoder iterations. The step size in the proposed quantization increases as the input values increase. Table 3 shows an implementation of the 6-bit novel quantization with increasing step size $\Delta$ from 1 to 4 and then to 8. Again, the table 3 shows only non-negative inputs. For negative input values, their positive counterparts' indices with negative signs are used. For example, the message index of input value −39 is −23.

TABLE 3

Novel 6-Bit Quantization with Increasing Step Size

| Input Values | Message Index |
|---|---|
| 0 | 0 |
| 1 | 1 |
| 2 | 2 |
| 3 | 3 |
| 4 | 4 |
| 5 | 5 |
| 6 | 6 |
| 7 | 7 |
| 8 | 8 |
| 9 | 9 |
| 10 | 10 |

TABLE 3-continued

Novel 6-Bit Quantization with Increasing Step Size

| Input Values | Message Index |
|---|---|
| 11 | 11 |
| 12 | 12 |
| 13 | 13 |
| 14 | 14 |
| 15 | 15 |
| 16 | 16 |
| 17 | 17 |
| 18 | 18 |
| 19 | 19 |
| [20, 23] | 20 |
| [24, 27] | 21 |
| [28, 31] | 22 |
| [32, 39] | 23 |
| [40, 47] | 24 |
| [48, 55] | 25 |
| [56, 63] | 26 |
| [64, 71] | 27 |
| [72, 79] | 28 |
| [80, 87] | 29 |
| [88, 95] | 30 |
| [96, ∞) | 31 |

In this implementation, one can see that, for input values less than 20, the proposed mapping is the same as conventional uniform quantization. However, by increasing the step size gradually, the novel mapping method can represent much larger values with the same 6-bit message index. Note that, mapping Table 3 is defined in such a way that it can be efficiently implemented in hardware. For input values greater than 31, the input value actually is floored by setting the 3 LSB (least significant bits) to 0. For example, 39 ($100111_2$) is first floored to 32 ($100000_2$), then mapped into message index 23. In such a way, the quantization can be carried out more efficiently by using a segmented linear function given in (10).

$$I(x) = \begin{cases} x, & \text{if } 0 \leq |x| < 20 \\ \text{sign}(x) \cdot (15 + |x|/4), & \text{if } 20 \leq |x| < 32 \\ \text{sign}(x) \cdot (19 + |x|/8), & \text{if } 32 \leq |x| < 96 \\ \text{sign}(x) \cdot 31, & \text{if } |x| \geq 96 \end{cases} \quad (10)$$

where sign(x) is the sign of x, |x| is the absolute value of x, and the division is integer division taking only the quotient.

In contrast, a straightforward implementation entails a look-up table of 128 entries, alternatively, it may use a look-up table of 32 entries while determining index by going through multiple comparisons. In comparison, the above intelligent design of mapping function (10) achieves both short timing and low complexity.

To convert the message index back into output values which will be used in VN update (2), the de-mapping table of Table 3 as shown in Table 4 may be used. Note that the output values take the middle value of the quantization range shown in Table II. The underlying reason is to round the precise value to its nearest neighbor entry. The segmented linear function corresponding to Table 4 is given in (11).

TABLE 4

Inverse Mapping Table of Table 3.

| Message Index | Output Values |
|---|---|
| 0 | 0 |
| 1 | 1 |
| 2 | 2 |
| 3 | 3 |
| 4 | 4 |
| 5 | 5 |
| 6 | 6 |
| 7 | 7 |
| 8 | 8 |
| 9 | 9 |
| 10 | 10 |
| 11 | 11 |
| 12 | 12 |
| 13 | 13 |
| 14 | 14 |
| 15 | 15 |
| 16 | 16 |
| 17 | 17 |
| 18 | 18 |
| 19 | 19 |
| 20 | 22 |
| 21 | 26 |
| 22 | 30 |
| 23 | 36 |
| 24 | 44 |
| 25 | 52 |
| 26 | 60 |
| 27 | 68 |
| 28 | 76 |
| 29 | 84 |
| 30 | 92 |
| 31 | 100 |

$$I^{-1}(x) = \begin{cases} x, & \text{if } 0 \leq |x| < 20 \\ \text{sign}(x) \cdot (22 + 4 \cdot (|x| - 20)), & \text{if } 20 \leq |x| < 23 \\ \text{sign}(x) \cdot (36 + 8 \cdot (|x| - 23)), & \text{if } |x| \geq 23 \end{cases} \quad (11)$$

The layered min-sum decoding of Algorithm 1 may be combined with the quantization method described above, to achieve the quantized min-sum algorithm as described in Algorithm 2 of Table 5. Using Algorithm 2, the observed error correction is further improved.

TABLE 5

Algorithm 2: Quantized Layered Min-Sum Decoding Algorithm

Algorithm 2 Quantized Layered Min-Sum Decoding Algorithm
Initialization: $\forall i \in V, \forall j \in C, L_{j \rightarrow i} = 0$; and $\forall i \in V, Q_i = I(L_i^{ch})$
Iteration:
1:    for $\forall j \in C$ do
2:       $L_{i \rightarrow j} \leftarrow I(I^{-1}(Q_i) - I^{-1}(L_{j \rightarrow i}))$, $\forall i \in N(j)$ 3:       $s_{all} \leftarrow \prod_{i' \in N(j)} \text{sign}(L_{i' \rightarrow j})$ 4:       $i_{min1} \leftarrow \underset{i' \in N(j)}{\text{argmin}} |L_{i' \rightarrow j}|$ 5:       $L_{min1} \leftarrow s_{all} \cdot L_{i_{min1} \rightarrow j}$ 6:       $i_{min2} \leftarrow \underset{i' \in N(j) \setminus i_{min1}}{\text{argmin}} |L_{i' \rightarrow j}|$ 7:       $L_{min2} \leftarrow s_{all} \cdot L_{i_{min2} \rightarrow j}$
8:       for $\forall i \in N(j)$ do TABLE 5-continued Algorithm 2: Quantized Layered Min-Sum Decoding Algorithm

```
 9:           if i ≠ i_min1 then
10:               L_{j→i} ← L_min1
11:           else
12:               L_{j→i} ← L_min2
13:           end if
14:           Q_i ← I(I^{-1}(L_{i→j}) + I^{-1}(L_{j→i}))
15:       end for
16:   end for
```

In this disclosure, a novel fast mapping and de-mapping method is proposed to perform the quantization operation needed in VN update of message-passing decoder of LDPC codes. The proposed method has been proved by simulation to provide better error correction performance, while offers low hardware implementation complexity. This method can be applied to all types of message-passing decoding algorithms of LDPC codes.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope

REFERENCES

[1] X. Zhang and P. Siegel, "Quantized min-sum decoders with low error floor for LDPC codes," in *Proc. IEEE Int. Symp. Inform. Theory (ISIT)*, Cambridge, Mass., Jul. 25, 2012, pp. 2871-2875.
[2] X. Zhang and P. Siegel, "Will the real error floor please stand up?" in *Proc. IEEE Int. Conf. Signal Process. Commun. (SPCOM)*, Bangalore, India, Jul. 22-25, 2012, pp. 1-5.

What is claimed is:

1. A method comprising:
   receiving, by an electronic device, input data; and
   performing, by the electronic device, layered min-sum decoding of the input data to generate decoded output data, the layered min-sum decoding including passing messages between variable nodes (VNs) and check nodes (CNs); and
   wherein the messages are quantized to obtain quantized messages such that the messages with values below a first threshold value are quantized according to a uniform quantization and the messages with values above or equal to the first threshold are quantized according to a first non-uniform quantization; and
   wherein each message of at least a portion of the messages is quantized by being first floored by setting one or more least significant bits (LSB) to a particular value to obtain a floored value and mapping the floored value to a quantized value.

2. The method of claim 1, wherein each message (x) of at least a portion of the messages is quantized according to a function I, where I is defined as:

$$I(x) = \begin{cases} x, & \text{if } 0 \leq |x| < 20 \\ \text{sign}(x) \cdot (15 + |x|/4), & \text{if } 20 \leq |x| < 32 \\ \text{sign}(x) \cdot (19 + |x|/8), & \text{if } 32 \leq |x| < 96 \\ \text{sign}(x) \cdot 31, & \text{if } |x| \geq 96 \end{cases}.$$

3. The method of claim 1, wherein each quantized message (x) of at least a portion of the quantized messages is inverse-quantized according to a function $I^{-1}$, where $I^{-1}$ is defined as:

$$I^{-1}(x) = \begin{cases} x, & \text{if } 0 \leq |x| < 20 \\ \text{sign}(x) \cdot (22 + 4 \cdot (|x| - 20)), & \text{if } 20 \leq |x| < 23 \\ \text{sign}(x) \cdot (36 + 8 \cdot (|x| - 23)), & \text{if } |x| \geq 23 \end{cases}.$$

4. The method of claim 1, wherein the quantized messages are represented using six bits and the first threshold is 20 base 10.

5. The method of claim 1, wherein the layered min-sum decoding is performed according to Algorithm 1 of Table 1 as follows:

Algorithm 1 Layered Min-Sum Decoding Algorithm

Initialization: $\forall i \in C$, $L_{j \to i} = 0$; and $\forall i \in V$, $Q_i = L_i^{ch}$
Iteration:
```
 1: for ∀j ∈ C do
 2:     L_{i→j} ← Q_i − L_{j→i}, ∀i ∈ N(j)
 3:     s_all ← ∏_{i'∈N(j)} sign(L_{i'→j})
 4:     i_min1 ← argmin_{i'∈N(j)} |L_{i'→j}|
 5:     L_min1 ← s_all · L_{i_min1 → j}
 6:     i_min2 ← argmin_{i'∈N(j)\i_min1} |L_{i'→j}|
 7:     L_min2 ← s_all · L_{i_min2 → j}
 8:     for ∀i ∈ N(j) do
 9:         if i ≠ i_min1 then
10:             L_{j→i} ← L_min1
11:         else
12:             L_{j→i} ← L_min2
13:         end if
14:         Q_i ← L_{i→j} + L_{j→i}
15:     end for
16: end for.
```

6. The method of claim 1, wherein the layered min-sum decoding is performed according to Algorithm 2 of Table 5 as follows:

Algorithm 2 Quantized Layered Min-Sum Decoding Algorithm

Initialization: $\forall i \in V$, $\forall j \in C$, $L_{j \to i} = 0$; and $\forall i \in V$, $Q_i = I(L_i^{ch})$
Iteration:
```
 1: for ∀j ∈ C do
 2:     L_{i→j} ← I(I^{-1}(Q_i) − I^{-1}(L_{j→i})), ∀i ∈ N(j)
 3:     s_all ← ∏_{i'∈N(j)} sign(L_{i'→j})
 4:     i_min1 ← argmin_{i'∈N(j)} |L_{i'→j}|
 5:     L_min1 ← s_all · L_{i_min1 → j}
 6:     i_min2 ← argmin_{i'∈N(j)\i_min1} |L_{i'→j}|
 7:     L_min2 ← s_all · L_{i_min2 → j}
```

| Algorithm 2 Quantized Layered Min-Sum Decoding Algorithm |
| --- |
| 8:     for $\forall i \in N(j)$ do |
| 9:       if $i \neq i_{min1}$ then |
| 10:         $L_{j \to i} \leftarrow L_{min1}$ |
| 11:       else |
| 12:         $L_{j \to i} \leftarrow L_{min2}$ |
| 13:       end if |
| 14:       $Q_i \leftarrow I(I^{-1}(L_{i \to j}) + I^{-1}(L_{j \to i}))$ |
| 15:     end for |
| 16: end for. |

7. The method of claim 1, wherein each message of at least the portion of the messages are quantized by being first floored by setting one or more least significant bits (LSB) to zero to obtain the floored value and mapping the floored value to the quantized value.

8. The method of claim 1, wherein the messages having values higher than a second threshold that is higher than the first threshold are quantized according to a second non-uniform quantization.

9. An electronic device including circuits configured to:
receive input data; and
perform layered min-sum decoding of the input data to generate decoded output data, the layered min-sum decoding including passing messages between variable nodes (VNs) and check nodes (CNs); and
wherein the messages are quantized to obtain quantized messages such that the messages with values below a first threshold value are quantized according to a uniform quantization and the messages with values above or equal to the first threshold are quantized according to a first non-uniform quantization; and
wherein the messages having values higher than a second threshold that is higher than the first threshold are quantized according to a second non-uniform quantization.

10. The electronic device of claim 9, wherein each message (x) of at least a portion of the messages is quantized according to a function I, where I is defined as:

$$I(x) = \begin{cases} x, & \text{if } 0 \leq |x| < 20 \\ \text{sign}(x) \cdot (15 + |x|/4), & \text{if } 20 \leq |x| < 32 \\ \text{sign}(x) \cdot (19 + |x|/8), & \text{if } 32 \leq |x| < 96 \\ \text{sign}(x) \cdot 31, & \text{if } |x| \geq 96 \end{cases}.$$

11. The electronic device of claim 9, wherein each quantized message (x) of at least a portion of the quantized messages is inverse-quantized according to a function $I^{-1}$, where $I^{-1}$ is defined as:

$$I^{-1}(x) = \begin{cases} x, & \text{if } 0 \leq |x| < 20 \\ \text{sign}(x) \cdot (22 + 4 \cdot (|x| - 20)), & \text{if } 20 \leq |x| < 23 \\ \text{sign}(x) \cdot (36 + 8 \cdot (|x| - 23)), & \text{if } |x| \geq 23 \end{cases}.$$

12. The electronic device of claim 9, wherein the quantized messages are represented using six bits and the first threshold is 20 base 10.

13. The electronic device of claim 9, wherein the layered min-sum decoding is performed according to Algorithm 1 of Table 1 as follows:

| Algorithm 1 Layered Min-Sum Decoding Algorithm |
| --- |
| Initialization: $\forall i \in V$, $\forall j \in C$, $L_{j \to i} = 0$; and $\forall i \in V$, $Q_i = L_i^{ch}$ |
| Iteration: |
| 1: for $\forall j \in C$ do |
| 2:     $L_{i \to j} \leftarrow Q_i - L_{j \to i}$, $\forall i \in N(j)$ |
| 3:     $s_{all} \leftarrow \prod_{i' \in N(j)} \text{sign}(L_{i' \to j})$ |
| 4:     $i_{min1} \leftarrow \arg\min_{i' \in N(j)} |L_{i' \to j}|$ |
| 5:     $L_{min1} \leftarrow s_{all} \cdot L_{i_{min1} \to j}$ |
| 6:     $i_{min2} \leftarrow \arg\min_{i' \in N(j) \setminus i_{min1}} |L_{i' \to j}|$ |
| 7:     $L_{min2} \leftarrow s_{all} \cdot L_{i_{min2} \to j}$ |
| 8:     for $\forall i \in N(j)$ do |
| 9:       if $i \neq i_{min1}$ then |
| 10:         $L_{j \to i} \leftarrow L_{min1}$ |
| 11:       else |
| 12:         $L_{j \to i} \leftarrow L_{min2}$ |
| 13:       end if |
| 14:       $Q_i \leftarrow L_{i \to j} + L_{j \to i}$ |
| 15:     end for |
| 16: end for. |

14. The electronic device of claim 9, wherein the layered min-sum decoding is performed according to Algorithm 2 of Table 5 as follows:

| Algorithm 2 Quantized Layered Min-Sum Decoding Algorithm |
| --- |
| Initialization: $\forall i \in V$, $\forall j \in C$, $L_{j \to i} = 0$; and $\forall i \in V$, $Q_i = I(L_i^{ch})$ |
| Iteration: |
| 1: for $\forall j \in C$ do |
| 2:     $L_{i \to j} \leftarrow I(I^{-1}(Q_i) - I^{-1}(L_{j \to i}))$, $\forall i \in N(j)$ |
| 3:     $s_{all} \leftarrow \prod_{i' \in N(j)} \text{sign}(L_{i' \to j})$ |
| 4:     $i_{min1} \leftarrow \arg\min_{i' \in N(j)} |L_{i' \to j}|$ |
| 5:     $L_{min1} \leftarrow s_{all} \cdot L_{i_{min1} \to j}$ |
| 6:     $i_{min2} \leftarrow \arg\min_{i' \in N(j) \setminus i_{min1}} |L_{i' \to j}|$ |
| 7:     $L_{min2} \leftarrow s_{all} \cdot L_{i_{min2} \to j}$ |
| 8:     for $\forall i \in N(j)$ do |
| 9:       if $i \neq i_{min1}$ then |
| 10:         $L_{j \to i} \leftarrow L_{min1}$ |
| 11:       else |
| 12:         $L_{j \to i} \leftarrow L_{min2}$ |
| 13:       end if |
| 14:       $Q_i \leftarrow I(I^{-1}(L_{i \to j}) + I^{-1}(L_{j \to i}))$ |
| 15:     end for |
| 16: end for. |

15. The electronic device of claim 9, wherein each message of at least a portion of the messages are quantized by being first floored by setting one or more least significant bits (LSB) to zero to obtain a floored value and mapping the floored value to a quantized value.

16. A method comprising:
receiving, by an electronic device, input data; and
performing, by the electronic device, layered min-sum decoding of the input data to generate decoded output data, the layered min-sum decoding including passing messages between variable nodes (VNs) and check nodes (CNs), wherein each message of at least a portion of the messages are quantized according to I(x) to obtain quantized messages, where I(x) is defined as:

$$I(x) = \begin{cases} x, & \text{if } 0 \le |x| < 20 \\ \text{sign}(x) \cdot (15 + |x|/4), & \text{if } 20 \le |x| < 32 \\ \text{sign}(x) \cdot (19 + |x|/8), & \text{if } 32 \le |x| < 96 \\ \text{sign}(x) \cdot 31, & \text{if } |x| \ge 96 \end{cases}.$$

17. The method of claim 16, further comprising:
inverse quantizing the quantized messages according to $I^{-1}(x)$ where $I^{-1}(x)$ is defined as:

$$I^{-1}(x) = \begin{cases} x, & \text{if } 0 \le |x| < 20 \\ \text{sign}(x) \cdot (22 + 4 \cdot (|x| - 20)), & \text{if } 20 \le |x| < 23 \\ \text{sign}(x) \cdot (36 + 8 \cdot (|x| - 23)), & \text{if } |x| \ge 23 \end{cases}.$$

18. The method of claim 16, wherein the layered min-sum decoding is performed according to Algorithm 1 of Table 1 as follows:

| Algorithm 1 Layered Min-Sum Decoding Algorithm |
| --- |
| Initialization: $\forall i \in C, L_{j \to i} = 0$; and $\forall i \in V, Q_i = L_i^{ch}$ <br> Iteration: <br>   1:  for $\forall j \in C$ do <br>   2:     $L_{i \to j} \leftarrow Q_i - L_{j \to i}, \forall i \in N(j)$ <br>   3:     $s_{all} \leftarrow \prod_{i' \in N(j)} \text{sign}(L_{i' \to j})$ <br>   4:     $i_{min1} \leftarrow \arg\min_{i' \in N(j)} |L_{i' \to j}|$ <br>   5:     $L_{min1} \leftarrow s_{all} \cdot L_{i_{min1} \to j}$ <br>   6:     $i_{min2} \leftarrow \arg\min_{i' \in N(j) \setminus i_{min1}} |L_{i' \to j}|$ <br>   7:     $L_{min2} \leftarrow s_{all} \cdot L_{i_{min2} \to j}$ <br>   8:     for $\forall i \in N(j)$ do <br>   9:         if $i \ne i_{min1}$ then <br> 10:            $L_{j \to i} \leftarrow L_{min1}$ <br> 11:         else <br> 12:            $L_{j \to i} \leftarrow L_{min2}$ <br> 13:         end if <br> 14:         $Q_i \leftarrow L_{i \to j} + L_{j \to i}$ <br> 15:     end for <br> 16: end for. |

19. The method of claim 16, wherein the layered min-sum decoding is performed according to Algorithm 2 of Table 5 as follows:

| Algorithm 2 Quantized Layered Min-Sum Decoding Algorithm |
| --- |
| Initialization: $\forall i \in V, \forall j \in C, L_{j \to i} = 0$; and $\forall i \in V, Q_i = I(L_i^{ch})$ <br> Iteration: <br>   1:  for $\forall j \in C$ do <br>   2:     $L_{i \to j} \leftarrow I(I^{-1}(Q_i) - I^{-1}(L_{j \to i})), \forall i \in N(j)$ <br>   3:     $s_{all} \leftarrow \prod_{i' \in N(j)} \text{sign}(L_{i' \to j})$ <br>   4:     $i_{min1} \leftarrow \arg\min_{i' \in N(j)} |L_{i' \to j}|$ <br>   5:     $L_{min1} \leftarrow s_{all} \cdot L_{i_{min1} \to j}$ <br>   6:     $i_{min2} \leftarrow \arg\min_{i' \in N(j) \setminus i_{min1}} |L_{i' \to j}|$ <br>   7:     $L_{min2} \leftarrow s_{all} \cdot L_{i_{min2} \to j}$ <br>   8:     for $\forall i \in N(j)$ do <br>   9:         if $i \ne i_{min1}$ then <br> 10:            $L_{j \to i} \leftarrow L_{min1}$ <br> 11:         else <br> 12:            $L_{j \to i} \leftarrow L_{min2}$ <br> 13:         end if <br> 14:         $Q_i \leftarrow I(I^{-1}(L_{i \to j}) + I^{-1}(L_{j \to i}))$ <br> 15:     end for <br> 16: end for. |

\* \* \* \* \*